(12) United States Patent
Katsura (10) Patent No.: US 9,226,350 B2
(45) Date of Patent: Dec. 29, 2015

(54) OSCILLATION CIRCUIT

(71) Applicant: Rohm Co., Ltd., Kyoto (JP)

(72) Inventor: Koji Katsura, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 14/159,493

(22) Filed: Jan. 21, 2014

(65) Prior Publication Data

US 2014/0203726 A1 Jul. 24, 2014

(30) Foreign Application Priority Data

Jan. 22, 2013 (JP) .................................. 2013-009208

(51) Int. Cl.
| | |
|---|---|
| *H05B 33/08* | (2006.01) |
| *H03B 23/00* | (2006.01) |
| *B60Q 1/00* | (2006.01) |
| *B60Q 11/00* | (2006.01) |
| *H03K 4/06* | (2006.01) |
| *H02M 3/156* | (2006.01) |

(52) U.S. Cl.
CPC .......... *H05B 33/0815* (2013.01); *B60Q 1/0094* (2013.01); *B60Q 11/005* (2013.01); *H03B 23/00* (2013.01); *H05B 33/089* (2013.01); *H05B 33/0818* (2013.01); *H05B 33/0887* (2013.01); *H02M 3/156* (2013.01); *H03K 4/06* (2013.01)

(58) Field of Classification Search
USPC ....................... 315/82; 331/53, 111, 143, 179
See application file for complete search history.

(56) References Cited

U.S. PATENT DOCUMENTS

| | | | | |
|---|---|---|---|---|
| 5,859,571 | A  * | 1/1999 | Lee et al. | 331/53 |
| 7,126,397 | B1 * | 10/2006 | Mok | 327/175 |
| 7,565,006 | B2 * | 7/2009 | Stam et al. | 382/155 |
| 2009/0092284 | A1 * | 4/2009 | Breed et al. | 382/103 |
| 2009/0096937 | A1 * | 4/2009 | Bauer et al. | 348/739 |
| 2011/0037416 | A1 * | 2/2011 | Nakamura | 315/307 |
| 2011/0080191 | A1 * | 4/2011 | Patel et al. | 327/105 |
| 2012/0181931 | A1 * | 7/2012 | Katsura | 315/82 |

FOREIGN PATENT DOCUMENTS

JP    4550661    7/2010

* cited by examiner

*Primary Examiner* — Douglas W Owens
*Assistant Examiner* — Syed M Kaiser
(74) *Attorney, Agent, or Firm* — Fish & Richardson P.C.

(57) ABSTRACT

An oscillation circuit includes: a ramp voltage generating unit configured to generate a ramp voltage; and a clock signal generating unit configured to generate a clock signal. The clock signal generating unit includes: a bias unit configured to apply one of the ramp voltage and a fixed voltage, as a bias voltage, to a resistor; and an oscillator configured to determine an oscillation frequency of the clock signal in response to a bias current flowing through the resistor.

7 Claims, 10 Drawing Sheets

OSCILLATION CIRCUIT

CROSS-REFERENCE TO RELATED APPLICATION

This application is based upon and claims the benefit of priority from Japanese Patent Application No. 2013-009208, filed on Jan. 22, 2013, the entire contents of which are incorporated herein by reference.

TECHNICAL FIELD

The present disclosure relates to an oscillation circuit having a frequency spreading function (spectrum spreading function).

BACKGROUND

Figure 10:
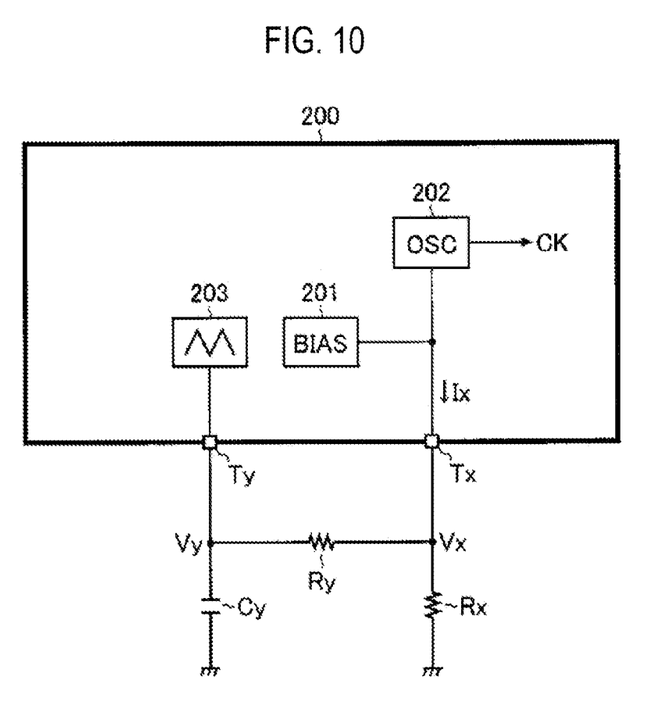
FIG. 10 is a block diagram showing one example of an oscillation circuit.

FIG. 10 is a block diagram showing one example of an oscillation circuit. This oscillation circuit includes a bias voltage generating unit 201, a clock signal generating unit 202, a ramp voltage generating unit 203, resistors Rx and Ry and a capacitor Cy.

The bias voltage generating unit 201 is incorporated in a semiconductor device 200 and applies a predetermined bias voltage Vx (for example, 1.5V) to an external terminal Tx.

The clock signal generating unit 202 is incorporated in the semiconductor device 200 and generates a clock signal CK of an oscillation frequency Fosc based on a reference current Ix flowing into the external terminal Tx.

The ramp voltage generating unit 203 is incorporated in the semiconductor device 200 and generates a triangular ramp voltage Vy (for example, 1V≤Vy≤2V) by charging/discharging the capacitor Cy externally attached to the external terminal Ty.

In the oscillation circuit as configured above, if the resistor Ry is not connected between the external terminal Tx and the external terminal Ty, the reference current Ix has a constant value (=Vx/Rx) uniquely determined depending on the resistance of the resistor Rx externally attached to the external terminal Tx. Further, the oscillation frequency Fosc of the clock signal CK also has a constant value.

On the other hand, when the resistor Ry is connected between the external terminal Tx and the external terminal Ty, the reference current Ix has a variable value (=Vx/Rx+(Vx−Vy)/Ry) periodically varied depending on the ramp voltage Vy. Further, the oscillation frequency Fosc of the clock signal CK also has a variable value. Accordingly, the oscillation frequency Fosc of the clock signal CK can be spread to reduce noise intensity.

However, the oscillation circuit has many parameters (Vx, Vy, Rx and Ry) included in a calculation equation for the reference current Ix in the frequency spreading and has a possibility of deviation of the oscillation frequency Fosc of the clock signal CK due to a variation of each parameter. In addition, this oscillation circuit has a problem of an increase in set size and cost due to an increase in the number of components.

SUMMARY

The present disclosure provides some embodiments of an oscillation circuit which is capable of performing a frequency spreading function in a simple manner.

According to one embodiment of the present disclosure, an oscillation circuit includes a ramp voltage generating unit configured to generate a ramp voltage; and a clock signal generating unit configured to generate a clock signal, wherein the clock signal generating unit includes: a bias unit configured to apply one of the ramp voltage and a fixed voltage, as a bias voltage, to a resistor; and an oscillator configured to determine an oscillation frequency of the clock signal in response to a bias current flowing through the resistor.

The ramp voltage generating unit may include: a first current source configured to generate a charging current of a capacitor; a second current source configured to generate a discharging current of the capacitor; a hysteresis comparator configured to generate a comparison signal by comparing a voltage across the capacitor with a threshold voltage; and a charging/discharging control unit configured to switch between charging and discharging of the capacitor in response to the comparison signal, wherein the voltage across the capacitor is output as the ramp voltage.

The bias unit may apply a lower one of the ramp voltage and the fixed voltage, as the bias voltage, to the resistor, and the ramp voltage generating unit may include a pull-up unit configured to make the ramp voltage higher than the fixe voltage at the start of the oscillation circuit.

The first current source and the second current source determine values of the charging current and the discharging current in response to the bias current.

According to another embodiment of the present disclosure, there is provided a semiconductor device comprising the above oscillation circuit integrated into the semiconductor device.

The semiconductor device may further include: a first external terminal connected to the resistor; and a second external terminal connected to the capacitor.

The semiconductor device may further include a switching power supply circuit configured to generate an output voltage from an input voltage using the clock signal generated in the oscillation circuit.

According to another embodiment of the present disclosure, there is provided an LED lighting device including: a light emitting diode (LED); and the above semiconductor device, wherein the semiconductor device is configured to supply an output voltage to the LED.

The LED lighting device may be provided as an LED headlight module, an LED turn lamp module or an LED rear lamp module.

According to another embodiment of the present disclosure, there is provided a vehicle including the above LED lighting device.

DETAILED DESCRIPTION

Some embodiments of the present disclosure will now be described in detail with reference to the drawings. Throughout the drawings, the same or similar elements, members and processes are denoted by the same reference numerals and explanation of which will not be repeated. The disclosed embodiments are provided for the purpose of illustration, not limitation, of the present disclosure and all features and combinations thereof described in the embodiments cannot be necessarily construed to describe the spirit of the present disclosure.

In the specification, the phrases "connection of a member A and a member B" and "a member A stacked on a member B" is intended to include direct physical connection of the member A and the member B as well as indirect connection thereof via other member as long as the other member has no substantial effect on the electrical connection of the member A and the member B or has no damage to functions and effects shown by a combination of the member A and the member B. Similarly, the phrase "interposition of a member C between a member A and a member B" is intended to include direct connection of the member A and the member C or direct connection of the member B and the member C as well as indirect connection thereof via other member as long as the other member has no substantial effect on the electrical connection of the member A, the member B and the member C or has no damage to functions and effects shown by a combination of the member A, the member B and the member C.

<Block Diagram>

Figure 1:
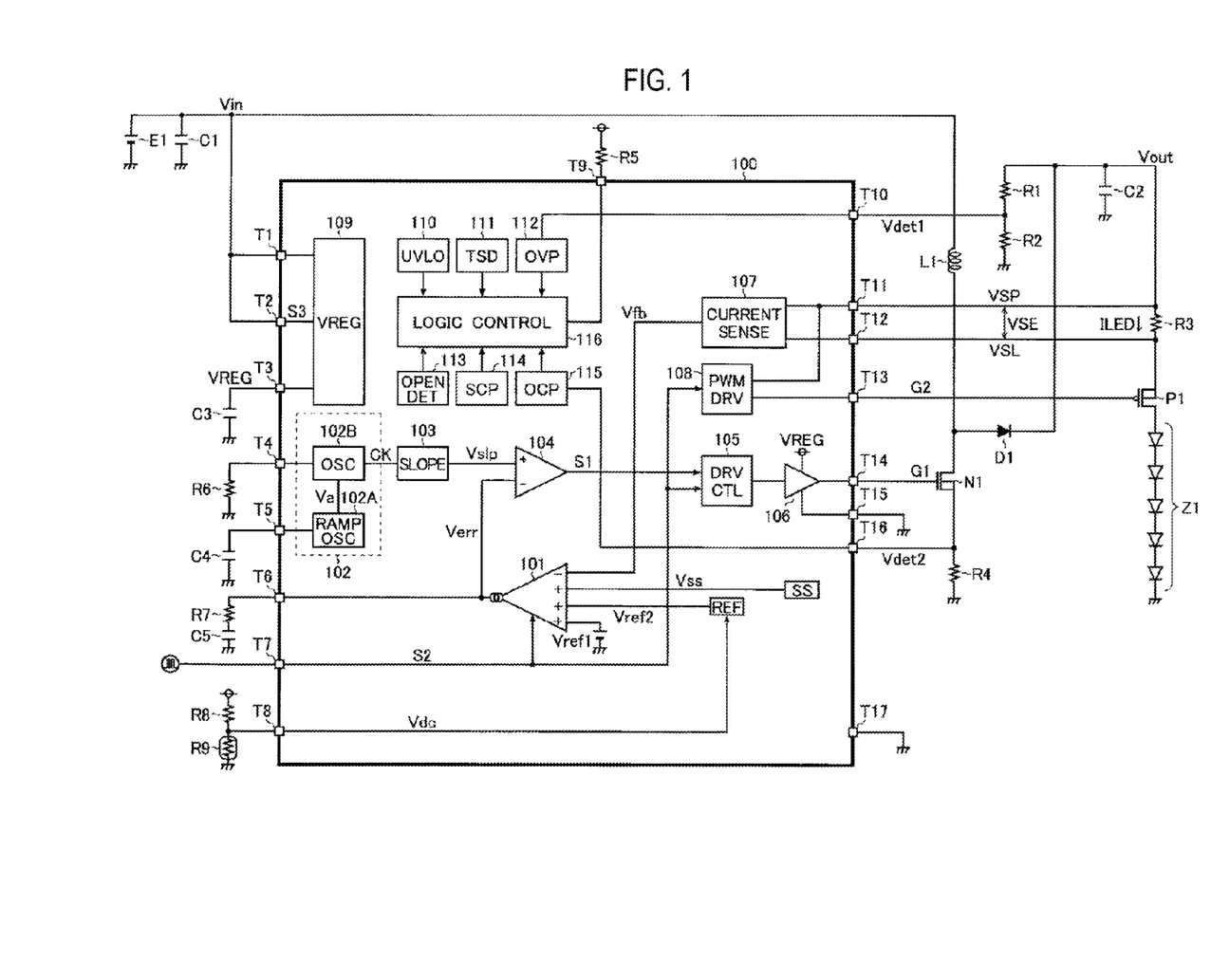
FIG. 1 is a block diagram showing one configuration example of a vehicle LED driver IC.

FIG. 1 is a block diagram showing one configuration example of a vehicle LED driver IC 100. In this configuration example, the vehicle LED driver IC 100 (hereinafter referred to as an IC 100") is implemented with a silicon monolithic semiconductor integrated circuit device including an integration of an error amplifier 101, an oscillation circuit 102, a slope voltage generating unit 103, a comparator 104, a driver control unit 105, a driver 106, a current detecting unit 107, a PWM (Pulse Width Modulation) driving unit 108, a reference voltage generating unit 109, an undervoltage detecting unit 110, a temperature abnormality detecting unit 111, an overvoltage detecting unit 112, an LED open detecting unit 113, an LED short detecting unit 114, an overcurrent detecting unit 115 and a logic control unit 116.

The IC 100 further includes external terminals T1 to T17 as means for establishing an external electrical connection. In a vehicle application (LED lighting device) illustrated in FIG. 1, the IC 100 is externally connected with a battery E1, a light emitting diode array (load) Z1, resistors R1 to R8, a negative temperature coefficient thermistor R9, capacitors C1 to C5, a coil L1, a diode D1, an N-channel MOS (Metal Oxide Semiconductor] field effect transistor N1 and a P-channel MOS field effect transistor P1.

A positive terminal of the battery E1 is connected to the external terminal T1 (VCC pin) and the external terminal T2 (EN pin). A negative terminal of the battery E1 is connected to a ground terminal. A first terminal of the capacitor C1 is connected to the external terminal T1. A second terminal of the capacitor C1 is connected to the ground terminal. A first terminal of the capacitor C3 is connected to the external terminal T3 (VREG terminal). A second terminal of the capacitor C3 is connected to the ground terminal. A first terminal of the resistor R6 is connected to the external terminal T4 (RT pin). A second terminal of the resistor R6 is connected to the ground terminal. A first terminal of the capacitor C4 is connected to the external terminal T5 (RS pin). A second terminal of the capacitor C4 is connected to the ground terminal. A first terminal of the resistor R7 is connected to the external terminal T6 (COMP pin). A second terminal of the resistor R7 is connected to a first terminal of the capacitor C5. A second terminal of the capacitor C5 is connected to the ground terminal. The external terminal T7 (PWM pin) is connected to a terminal for applying a PWM dimming signal. A first terminal of the resistor R8 is connected to a terminal for applying a reference voltage VREG. A second terminal of the resistor R8 and a first terminal of the negative temperature coefficient thermistor R9 are both connected to the external terminal T8 (DC pin). A second terminal of the negative temperature coefficient thermistor R9 is connected to the ground terminal. A first terminal of the resistor R5 is connected to the terminal for applying the reference voltage VREG. A second terminal of the resistor R5 is connected to the external terminal T9 (FAIL pin).

A first terminal of the coil L1 is connected to the positive terminal of the battery E1. A second terminal of the coil L1 is connected to a drain of the transistor N1 and an anode of the diode D1. A gate of the transistor N1 is connected to the external terminal T14 (SWOUT pin). A source and a back gate of the transistor N1 are connected to a first terminal of the resistor R4 and the external terminal T16 (CS pin). A second terminal of the resistor R4 is connected to the ground terminal. A cathode of the diode D1 is connected to a first terminal of the resistor R1, a first terminal of the capacitor C2 and a first terminal of the resistor R3. A second terminal of the resistor R1 and a first terminal of the resistor R2 are both connected to the external terminal T10 (ODT pin). A second terminal of the resistor R2 is connected to the ground terminal. A second terminal of the capacitor C2 is connected to the ground terminal. The first terminal of the resistor R3 is connected to the external terminal T11 (SP pin). A second terminal of the resistor R3 is connected to the external terminal T12 (SL pin). A source and a back gate of the transistor P1 are connected to the second terminal of the resistor R3. A gate of the transistor P1 is connected to the external terminal T13 (PWMG pin). A drain of the transistor P1 is connected to an anode of the light emitting diode array Z1. A cathode of the light emitting diode Z1 is connected to the ground terminal. The external terminal T15 (DGND pin) and the external terminal T17 (GND pin) are both connected to the ground terminal.

Subsequently, an outline of each of the circuit blocks integrated into the IC 100 will be described.

The error amplifier 101 generates an error voltage Verr in the external terminal T6 by generating a charging/discharging current of the capacitor C5 based on a difference between the lowest one of a reference voltage Vref1, a reference voltage Vref2 and a soft-start voltage Vss applied respectively to three non-inverting (+) input terminals and a feedback voltage Vfb applied to an inverting (−) input terminal.

After an input voltage Vin is input to the IC 100, the soft-start voltage Vss rises more smoothly than the reference voltage Vref1 and finally rises to a voltage higher than the reference voltage Vref1. Accordingly, when IC 100 is powered up, an output feedback control (soft-start control) is performed to match the feedback voltage Vfb with the soft-start voltage Vss, thereby preventing an inrush current from flowing into the capacitor C2 and the light emitting diode array Z1.

The reference voltage Vref2 is varied depending on a terminal voltage Vdc of the external terminal T8. Therefore, the external terminal T8 can be used to linearly control an output current ILED to the light emitting diode array Z1 based on the terminal voltage Vdc. The external terminal T8 is mainly used for derating. Specifically. The external terminal T8 is used to suppress the light emitting diode array Z1 from deteriorating at a high temperature and suppress an overcurrent from flowing into external components under conditions where a supply voltage is likely fluctuate (such as when an idling stop function is implemented).

The error amplifier 101 is allowed/disallowed to perform an output operation based on a PWM dimming signal S2 input through the external terminal T7. To be specific, the output operation of the error amplifier 101 is allowed when the PWM dimming signal S2 has a high level, while being disallowed when the PWM dimming signal S2 has a low level.

The oscillation circuit 102 includes a ramp voltage generating unit 102A to generate a ramp voltage Va and a clock signal generating unit 102B to generate a clock signal CK. A configuration and operation of the oscillation circuit 102 will be described later in more detail.

The slope voltage generating unit 103 uses the clock signal CK to generate a sawtooth or triangular slope voltage Vslp.

The comparator 104 generates a comparison signal S1 by comparing the error signal Verr applied to an inverting (−) input terminal with the slope voltage Vslp applied to a non-inverting (+) input terminal.

The driver control unit 105 controls turning-on/off of the transistor N1 by driving the driver 106 based on the comparison signal S1. The driver control unit 105 is allowed/disallowed to perform an output operation based on the PWM dimming signal S2. To be specific, the output operation of the driver control unit 105 is allowed when the PWM dimming signal S2 has a high level, while being disallowed when the PWM dimming signal S2 has a low level.

The driver 106 generates a gate signal G1 (high level: VREG, low level: DGND) of the transistor N1 in response to an instruction from the driver control unit 105 and outputs it to the external terminal T14.

The current detecting unit 107 monitors a voltage (a sense voltage VSE (=VSP−VSL) varied depending on the output current ILED) applied between the external terminal T11 and the external terminal T12 and generates the feedback voltage Vfb based on the monitored voltage.

The PWM driving unit 108 generates a gate signal G2 of the transistor P1 based on the PWM dimming signal S2. To be specific, the PWM driving unit 108 sets the gate signal G2 to a low level when the PWM dimming signal S2 has a high level, while setting the gate signal G2 to a high level when the PWM dimming signal S2 has a low level. Accordingly, by inputting the PWM dimming signal S2 to the external terminal T7, the output current ILED can be controlled in a time division manner and brightness can be linearly controlled.

The reference voltage generating unit 109 generates the reference voltage VREF (for example, 5V) from the input voltage Vin (for example, 5V to 60V) applied to the external terminal T1 and outputs the reference voltage VREF to the external terminal T3. In addition, the reference voltage generating unit 109 is allowed/disallowed to perform an output operation based on an enable signal S3 input through the external terminal T2. To be specific, the output operation of the reference voltage generating unit 109 is allowed when the enable signal S3 has a high level, while being disallowed when the enable signal S3 has a low level.

The undervoltage detecting unit 110 detects an undervoltage by monitoring the reference voltage VREG. For example, if VREG≤4.3V, an undervoltage is detected and all circuit blocks except the reference voltage generating unit 109 are shut down. On the other hand, when VREG≥4.3V, the shut-down is released.

The temperature abnormality detecting unit 111 detects temperature abnormality by monitoring a junction temperature Tj of the IC 100. For example, if Tj≥175 degrees C., temperature abnormality is detected and all circuit blocks except the reference voltage generating unit 109 are shut down. On the other hand, if Tj≤150 degrees C., the shut-down is released.

The overvoltage detecting unit 112 detects an overvoltage by monitoring a terminal voltage Vdet1 (=a division of an output voltage Vout) of the external terminal T10.

The LED open detecting unit 113 detects LED open by monitoring the sense voltage VSE as well as a result of the detection by the overvoltage detecting unit 112. For example, if VSE≤50 mV and Vdet1≥2V, LED open is detected and all circuit blocks except the reference voltage generating unit 109 are shut down. On the other hand, when the enable signal S3 is again input, the shut-down is released.

The LED short detecting unit 114 detects an LED short by monitoring the terminal voltage VSL of the external terminal T12 and the sense voltage VSE. For example, if VSL≤2V or VSE≥0.3V, an LED short is detected and the soft-start voltage Vss is discharged to stop DC/DC switching. On the other hand, if VSL>2V or VSE<0.3V, the soft-start voltage Vss begins to be recharged to restart the DC/DC switching.

The overcurrent detecting unit 115 detects an overcurrent by monitoring a terminal voltage (a voltage signal depending on a current flowing through the transistor N1) of the external terminal T16. For example, if Vdet2≥0.4V, an overcurrent is detected and the soft-start voltage Vss is discharged to stop DC/DC switching. On the other hand, if Vdet2<0.4V, the soft-start voltage Vss begins to be recharged to restart the DC/DC switching.

The logic control unit 116 performs the above-mentioned shut-down control based on results of the detection by the undervoltage detecting unit 110, the temperature abnormality detecting unit 111, the overvoltage detecting unit 112, the LED open detecting unit 113, the LED short detecting unit 114 and the overcurrent detecting unit 115 and, at the same time, performs an open drain output control of a protection flag signal FAIL using the external terminal T9.

Among the above components, the error amplifier 101, the oscillation circuit 102, the slope voltage generating unit 103, the comparator 104, the driver control unit 105, the driver 106 and a group of discrete parts (the transistor N1, the coil L1, the diode D1, the resistors R1 to R4 and the capacitor C2) forming an output stage correspond to a switching power supply circuit which uses the clock signal CK generated in the oscillation circuit 102 to generate an output voltage Vout from an input voltage Vin and supplies the output voltage Vout to the light emitting diode array Z1.

Although FIG. 1 illustrates a step-up output stage of the switching power supply circuit, the output stage is not limited thereto but may cope with step-down, step-down/step-up and SEPIC types.

<First Configuration Example of Oscillation Circuit>

Figure 2:
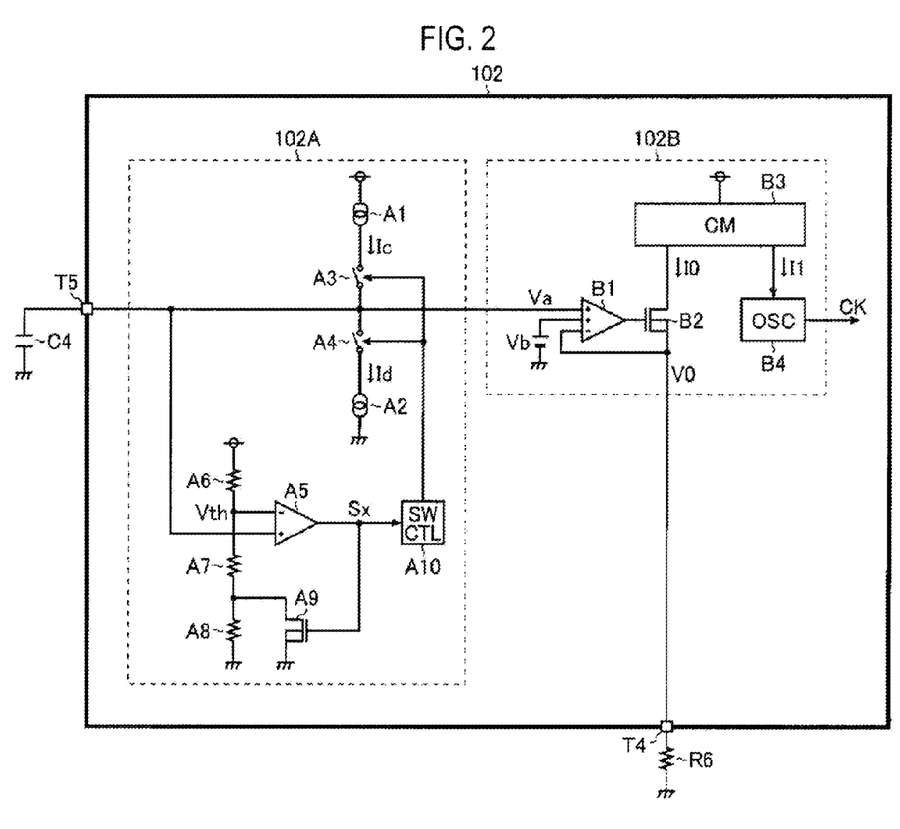
FIG. 2 is a circuit diagram showing a first configuration example of an oscillation circuit.

FIG. 2 is a circuit diagram showing a first configuration example of the oscillation circuit 102. In the oscillation circuit 102 of the first configuration example, the ramp voltage generating unit 102A includes current sources A1 and A2, switches A3 and A4, a comparator A5, resistors A6 to A8, an N channel MOS field effect transistor A9 and a switch control unit A10 and outputs a voltage (charging voltage) across the capacitor C4 externally attached to the external terminal T5 as the ramp voltage Va.

The current sources A1 and A2 generate a charging current Ic and a discharging current Id of the capacitor C4, respectively. The switches A3 and A4 conduct/interrupt current passes of the charging current Ic and the discharging current Id in response to an instruction from the switch control unit A10, respectively. To explain a connection relationship in detail, a first terminal of the current source A1 is connected to an application terminal for the reference voltage VREG. A second terminal of the current source A1 is connected to the external terminal T5 via the switch A3. A first terminal of the current source A2 is connected to the external terminal T5 via the switch A4. A second terminal of the current source A2 is connected to a ground terminal The comparator A5, the resistors A6 to A8 and the transistor A9 form a hysteresis comparator to generate a comparison signal Sx by comparing the ramp voltage Va with a threshold voltage Vth (VthH/VthL). To explain a connection relationship in detail, a non-inverting (+) input terminal of the comparator A5 is connected to the external terminal T15. A first terminal of the resistor A6 is connected to an application terminal for the reference voltage VREG. A connection node between a second terminal of the resistor A6 and a first terminal of the resistor A7 is connected, as an application terminal for the threshold voltage Vth (VthH/VthL), to an inverting input terminal (−) input terminal of the comparator A5. A second terminal of the resistor A7 is connected to a first terminal of the resistor A8 and a drain of the transistor A9. A second terminal of the resistor A9 and a source and a back gate of the transistor A9 are both connected to the ground terminal. A gate of the transistor A9 is connected to an output terminal of the comparator (application terminal for the comparison signal Sx).

The switch control unit A10 corresponds to a charging/discharging control unit which switches between charging and discharging of the capacitor C4 by performing a switching on/off control for the switches A3 and A4 based on the comparison signal Sx.

In the oscillation circuit 102 of the first configuration example, the clock signal generating unit 102B includes an operational amplifier B1, an N channel MOS field effect transistor B2, a current mirror B3 and an oscillator B4 and generates a clock signal CK having an oscillation frequency Fosc based on a ramp signal Va.

The operational amplifier B1 and the transistor B2 form a bias unit to apply a lower one of the ramp voltage Va and a fixed voltage Vb, as a bias voltage V0, to the resistor R6. To explain a connection relationship in detail, a first non-inverting (+) input terminal of the operational amplifier B1 is connected to an application terminal for the ramp voltage Va. A second non-inverting (+) input terminal of the operational amplifier B1 is connected to an application terminal for the fixed voltage Vb. An inverting (−) input terminal of the operational amplifier B1 is connected to the external terminal T4. An output terminal of the operational amplifier B1 is connected to a gate of the transistor B2. A drain of the transistor B2 is connected to an input terminal of the current mirror B3. A source and a back gate of the transistor B2 are both connected to the external terminal T4.

The current mirror B3 generates a mirror current I1 by mirroring a bias current I0 (=V0/R6) flowing through the resistor R6.

The oscillator B4 determines the oscillation frequency Fosc of the clock signal CK by adjusting a charging/discharging current for an internal capacitor (not shown) based on the mirror current I1 (further the bias current I0).

Figure 3:
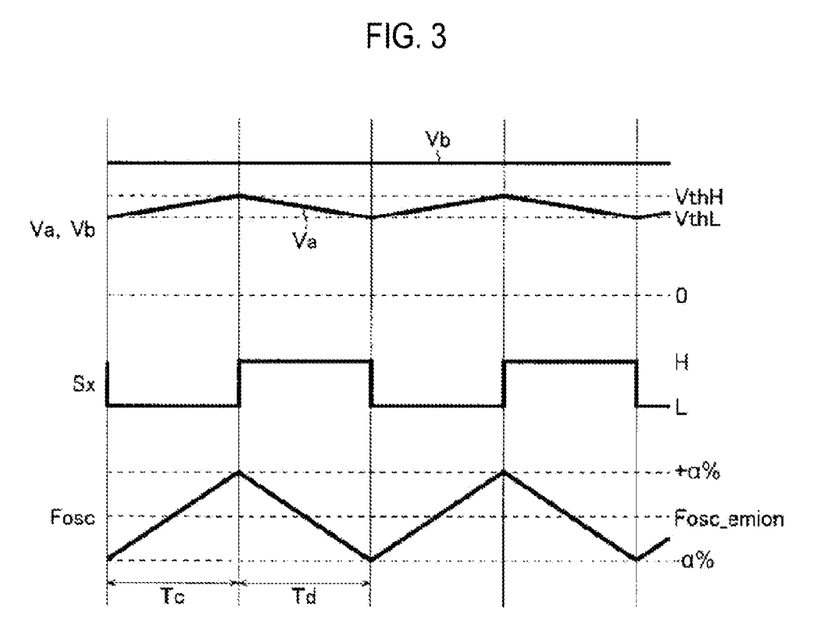
FIG. 3 is a timing chart showing one example of a frequency spreading operation.

Next, a frequency spreading operation of the oscillation circuit 102 as configured above will be described in detail with reference to FIG. 3. FIG. 3 is a timing chart showing one example of frequency spreading operation, showing the ramp voltage Va, the fixed voltage Vb, the comparison signal Sx and the oscillation frequency Fosc from top to bottom.

When the comparison signal Sx has a low level, the transistor A9 is turned off, and an upper threshold voltage VthH (for example, 0.9V) is generated as the threshold voltage Vth. When the comparison signal Sx has the low level, the switch control unit A10 switches on the switch A3 and switches off the switch A4. Accordingly, in a low level period Tc of the comparison signal Sx, the capacitor C4 is charged by the charging current Ic and the ramp voltage Va rises accordingly.

When the capacitor C4 continues to be charged and the ramp voltage Va becomes higher than the upper threshold voltage VthH (high level), the comparison signal Sx rises from a low level to a high level. At this time, since the transistor A9 is turned on, the threshold voltage Vth is lowered from the upper threshold voltage VthH to a lower threshold voltage VthL (for example, 0.7V). Accordingly, the comparison signal Sx is maintained at a high level until the ramp voltage Va falls below the lower threshold voltage VthL. On the other hand, when the comparison signal Sx has a high level, the switch control unit A10 switches off the switch A3 and switches on the switch A4. Accordingly, in a high level period Td of the comparison signal Sx, the capacitor C4 is discharged by the discharging current Id and the ramp voltage Va falls accordingly.

When the capacitor C4 continues to be discharged and the ramp voltage Va becomes lower than the lower threshold voltage VthL (low level), the comparison signal Sx falls from a high level to a low level and the threshold voltage Vth rises from the lower threshold voltage VthL to the upper threshold voltage VthH again. Accordingly, the comparison signal Sx is maintained at a low level until the ramp voltage Va exceeds the upper threshold voltage VthH.

The same operation is repeated thereafter, and a periodically varying triangular ramp voltage Va with an average (for example, 0.8V) of the upper threshold voltage VthH and the lower threshold voltage VthL as a center value is generated.

The operational amplifier B1 controls the gate of the transistor B2 such that a lower one of the ramp voltage Va and the fixed voltage Vb is equal to the bias voltage V0. For example, assuming that 0.7V≤Va≤0.9V and Vb=1.2V, a lower ramp voltage Va is applied, as the bias voltage V0, to the resistor R6. Accordingly, the bias current I0 flowing through the resistor R6 is periodically varied depending on the ramp voltage Va.

As described earlier, the oscillator B4 determines the oscillation frequency Fosc of the clock signal CK based on the bias current I0. Accordingly, the oscillation frequency Fosc of the clock signal CK is periodically varied depending on the ramp voltage Va.

When a frequency spreading function (low EMI (Electro Magnetic Interference) function) is enabled, a center value Fosc_emion of the oscillation frequency Fosc is determined based on the center value (=(VthH+VthL)/2) of the ramp voltage Va and resistance of the resistor R6. Further, a modulation degree (±α%) of the oscillation frequency Fosc is determined based on the upper and lower limits of the ramp voltage Va and the resistance of the resistor R6.

On the other hand, when the frequency spreading function is disabled, the external terminal T5 and the external terminal T3 may be shorted and the ramp voltage Va may be pulled-up to the reference voltage VREG (for example, 5V) higher than the fixed voltage Vb (for example, 1.2V). Such connection allows the clock signal CK to be fixed to an oscillation frequency Fosc_emioff in response to the fixed voltage Vb. At this time, since the comparison signal Sx is at a high level at all times and thus the switch control unit A10 remains switched on at all times, the discharging current Id continues to flow. However, if the discharging current Id is designed to have a sufficiently small value (for example, μA order), the current consumption may be ignored.

With the configuration having the external terminal T4 for externally connecting the resistor R6, the resistance of the resistor R6 may be adjusted to set the oscillation frequency Fosc (_emion/_emioff) of the clock signal CK in a random manner.

However, since there is a difference between the center value of the ramp voltage Va and the fixed voltage Vb, there is a need to change the resistance of the resistor R6 depending on ON/OFF of the frequency spreading function in order to adjust the oscillation frequency Fosc of the clock signal CK to a desired value. For example, assuming that the center value of the ramp voltage Va is 0.8V and the fixed voltage Vb is 1.2V, the resistance of the resistor R6 when the frequency spreading function is enabled may be set to 2/3 (=0.8V/1.2V) of that when the frequency spreading function is disabled.

The low level period Tc (charging time of the capacitor C4) and high level period Td (discharging time of the capacitor C4) of the comparison signal Sx are calculated according to the following equations 1a and 1b, respectively.

$$Tc = C4 \times \Delta V / Ic \quad (1a)$$

$$Td = C4 \times \Delta V / Id \quad (1b)$$

Where, $\Delta V = VthH - VthL$

Accordingly, assuming that Ic=Id=IRS, an oscillation frequency Framp (=1/(Tc+Td)) of the ramp voltage Va is calculated according to the following equation 2.

$$Framp = IRS / (2 \times C4 \times \Delta V) \quad (2)$$

With the configuration having the external terminal T5 for externally connecting the capacitor C4, the oscillation frequency Framp of the ramp voltage Va (further a variation frequency obtained when the oscillation frequency Fosc of the clock signal CK is varied periodically) can be set arbitrarily by adjusting the capacitance of the capacitor C4.

Figure 4:
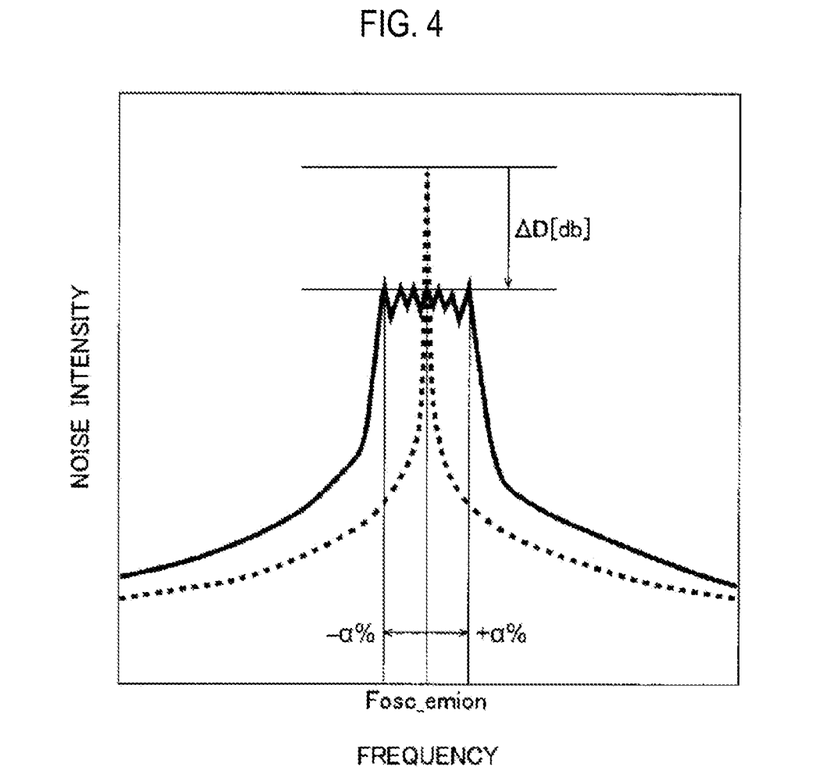
FIG. 4 is a view showing one example of noise reduction by the frequency spreading operation.

FIG. 4 is a view showing one example of noise reduction by the frequency spread operation. In this figure, the vertical axis represents noise intensity and the horizontal axis represents a frequency. In the figure, a solid line represents a spectrum obtained when the frequency spreading function is enabled and a dashed line represents a spectrum obtained when the frequency spreading function is disabled.

As shown in the figure, the noise intensity has a narrow spectrum having a larger peak value when the frequency spreading function is disabled, whereas it has a wide spectrum having a smaller peak value when the frequency spreading function is enabled. Although FIG. 4 depicts only a fundamental wave, the peak value of the spectrum for harmonics may be also greatly reduced when the frequency spreading function is enabled. A theoretical attenuation ΔD[dB] can be calculated according to the following equation 3.

$$\Delta D[dB] = 10 \times \log(4 / (Fosc\_emion \times C4 \times R6)) \quad (3)$$

Thus, the oscillation circuit 102 having the frequency spreading function can be used to suppress noise caused by the clock signal CK, which can result in reducing the number of external components for EMI countermeasure, set compactness and cost reduction.

The oscillation circuit 102 of the first configuration example can realize the frequency spreading function, without using the external resistor Ry, more simply than the configuration shown in FIG. 10, thereby reducing variations of the oscillation frequency Fosc and achieving set compactness and reduction in costs.

<Second Configuration Example of Oscillation Circuit>

Figure 5:
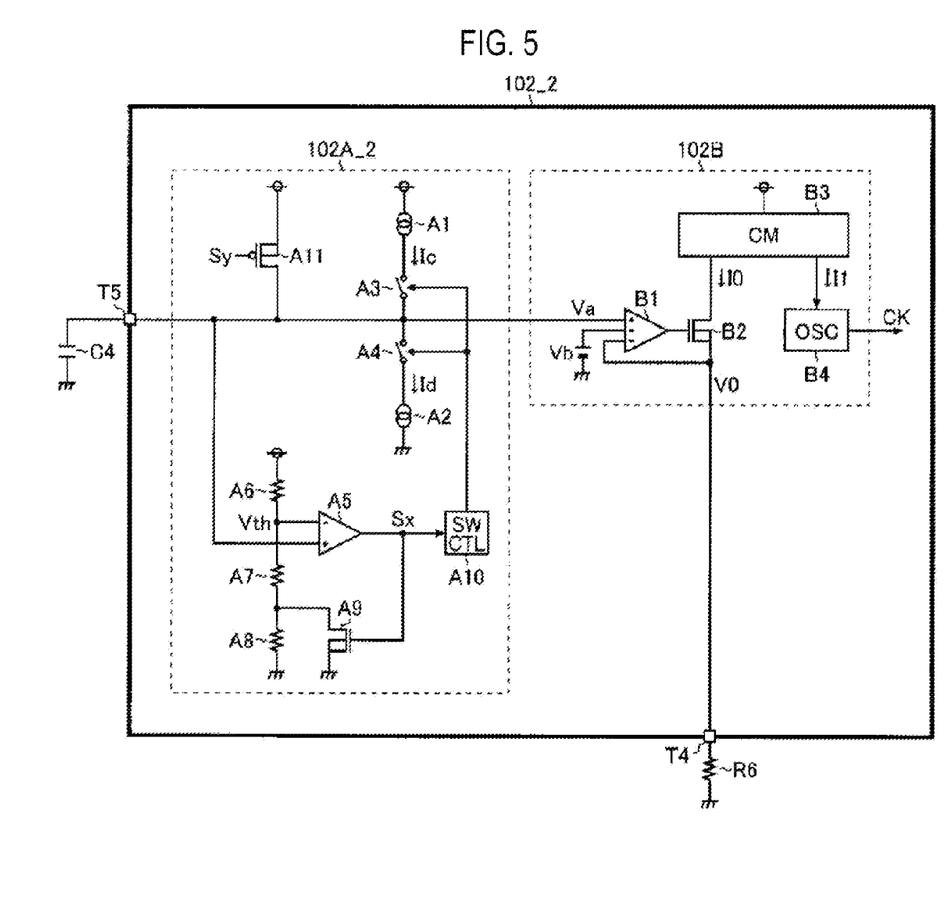
FIG. 5 is a circuit diagram showing a second configuration example of the oscillation circuit.

FIG. 5 is a circuit diagram showing an oscillation circuit 102_2 of a second configuration example. The oscillation circuit 102_2 of the second configuration example has basically the same configuration as that of the first configuration example except that a ramp voltage generating unit 102A_2 includes a P channel MOS field effect transistor A11. Therefore, the same elements as the first configuration example are denoted by the same reference numerals as FIG. 2, an explanation of which will not be repeated. The following description will be focused on characteristic portions of the second configuration example.

The transistor A11 corresponds to a pull-up unit to make the ramp voltage Va higher than the fixed voltage Vb at the start of the oscillation circuit 102_2. To explain a connection relationship in detail, a source and a back gate of the transistor A11 are connected to an application terminal for the reference voltage VREG. A drain of the transistor A11 is connected to the external terminal T5. A gate of the transistor A11 is connected to an application terminal for a start detection signal Sy. The start detection signal Sy is a binary signal generated, for example, by comparing the soft-start voltage Vss h a predetermined threshold voltage VTR.

Figure 6:
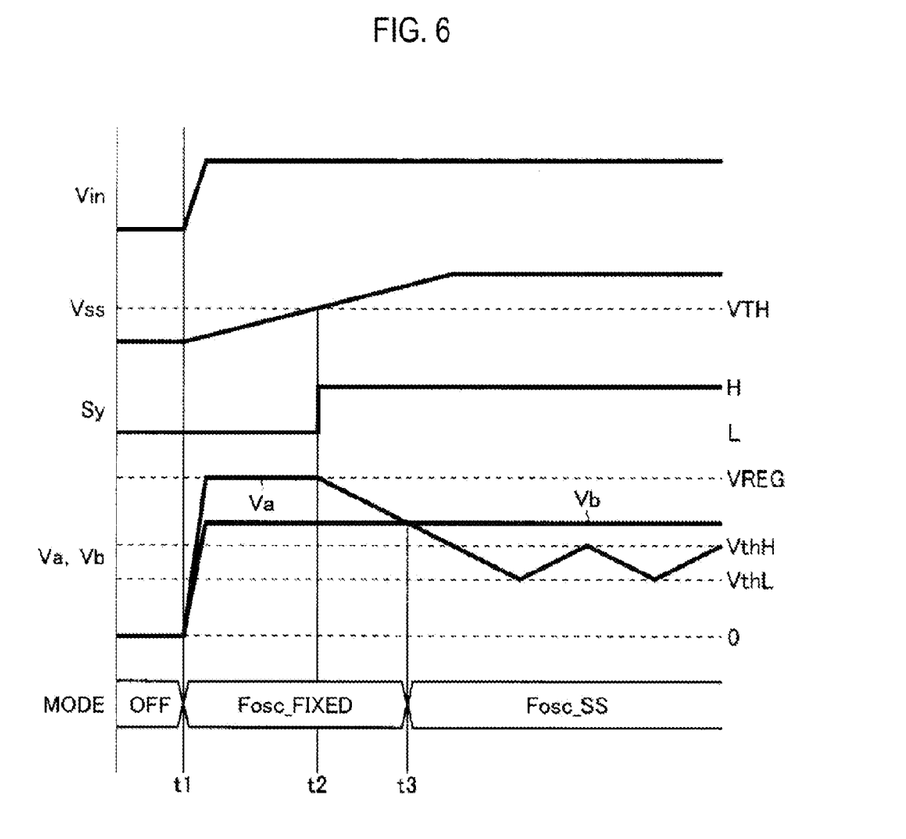
FIG. 6 is a timing chart showing one example of mode switching in startup.

FIG. 6 is a timing chart showing one example of mode switching in the start of the oscillation circuit 102_2, showing the input voltage Vin, the soft-start voltage Vss, the start detection signal Sy, the ramp voltage Va, the fixed voltage Vb and the operation mode of the oscillation circuit 102_2 from top to bottom.

At time t1, when the input voltage Vin is input, the soft-start voltage Vss begins to rise smoothly. However, at this point of time, since the soft-start voltage Vss is lower than the threshold voltage VTH, the start detection signal remains at a low level. As a result, since the transistor A11 is turned on and the ramp voltage Va is pulled up to the reference voltage VREG higher than the fixed voltage, the frequency spreading function is disabled and the clock signal CK is fixed to the oscillation frequency Fosc depending on the fixed voltage Vb. In addition, when the transistor A11 is turned on, since the comparison signal Sx remains at a high level at all times, like when the external terminal T5 is shorted to the external terminal T3, the discharging current Id continues to flow. However, if the discharging current Id is designed to have a sufficiently small value (for example, μA order), the current consumption may be ignored.

With the soft-start voltage continuing to rise, at time t2, when the soft-start voltage Vss becomes higher than the threshold voltage VTH, the start detection signal Sy rises to a high level. As a result, the transistor A11 is turned off and the ramp voltage Va is gradually decreased with the discharging of the capacitor C4. However, during a period in which the lamp voltage Va is higher than the fixed voltage Vb, the frequency spreading function remains disabled.

Thereafter, as the capacitor C4 proceeds to be discharged, at time t3, when the ramp voltage Va becomes lower than the fixed voltage Vb, the frequency spreading function is activated and the oscillation frequency Fosc of the clock signal CK is periodically varied depending on the ramp voltage Va.

Thus, by employing a sequence of disabling the frequency spreading function at the start of the oscillation circuit 102_2 and then enabling the frequency spreading function from the time when a predetermined period has elapsed, a high impedance state (an undefined logical state of the comparison signal Sx) of the external terminal T5 can be promptly eliminated at the start of the oscillation circuit 102_2 thereby preventing poor start of the oscillation circuit 102_2.

<Third Configuration Example of Oscillation Circuit>

Figure 7:
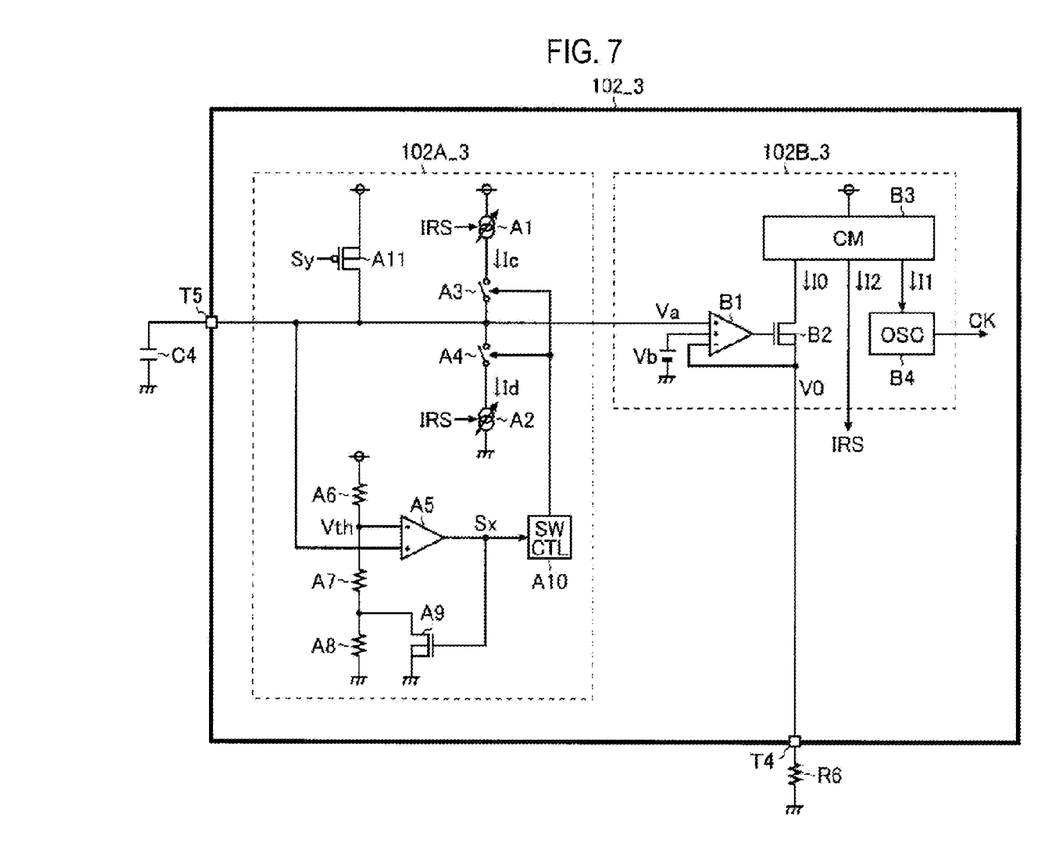
FIG. 7 is a circuit diagram showing a third configuration example of the oscillation circuit.

FIG. 7 is a circuit diagram showing an oscillation circuit 102_3 of a third configuration example. The oscillation circuit 102_3 of the third configuration example has basically the same configuration as those of the first and second configuration examples except that the current sources A1 and A2 determine values of the charging current Ic and the discharging current Id depending on the bias current I0. Therefore, the same elements as the first and second configuration examples are denoted by the same reference numerals as FIGS. 2 to 5, an explanation of which will not be repeated. The following description will be focused on characteristic portions of the third configuration example.

In the oscillation circuit 102_3 of the third configuration example, the current mirror B3 generates the mirror current I1 to be supplied to the oscillator B4 by mirroring the bias current I0 and, at the same time, generates a mirror current I2 (its value: IRS) to be supplied to the current sources A1 and A2. The current sources A1 and A2 output the mirror current I2 as the charging current Ic and the discharging current Id, respectively.

With this configuration, when the resistance of the resistor R6 is determined by a user in order to set the oscillation frequency Fosc of the clock signal CK, a value of the bias current I0 is accordingly determined and the charging current Ic and the discharging current Id are determined as well.

For example, the smaller resistance of the resistor R6 provides a larger value of the bias current I0 and a higher oscillation frequency Fosc of the clock signal CK. In this case, the charging current Ic and the discharging current Id are also increased and, accordingly, the oscillation frequency Framp of the lamp voltage Va becomes higher depending on the oscillation frequency Fosc of the clock signal CK.

On the contrary, the larger resistance of the resistor R6 provides a smaller value of the bias current I0 and a lower oscillation frequency Fosc of the clock signal CK. In this case, the charging current Ic and the discharging current Id are also decreased and, accordingly, the oscillation frequency Framp of the lamp voltage Va becomes lower depending on the oscillation frequency Fosc of the clock signal CK.

For example, Framp=300 Hz for Fosc=300 kHz and Framp=900 Hz for Fosc=900 kHz.

Thus, with the oscillation circuit 102_3 of the third configuration example, the oscillation frequency Fosc of the clock signal CK and the oscillation frequency Framp of the ramp voltage Va (further a variation frequency obtained when the oscillation frequency Fosc of the clock signal CK is varied periodically) can be changed in association with each other. Accordingly, the resistance of the resistor R6 can be adjusted with no need to adjust the capacitance of the capacitor C4, which can result in improved usability.

<Vehicle and LED Ramp Module>

Figure 8A:
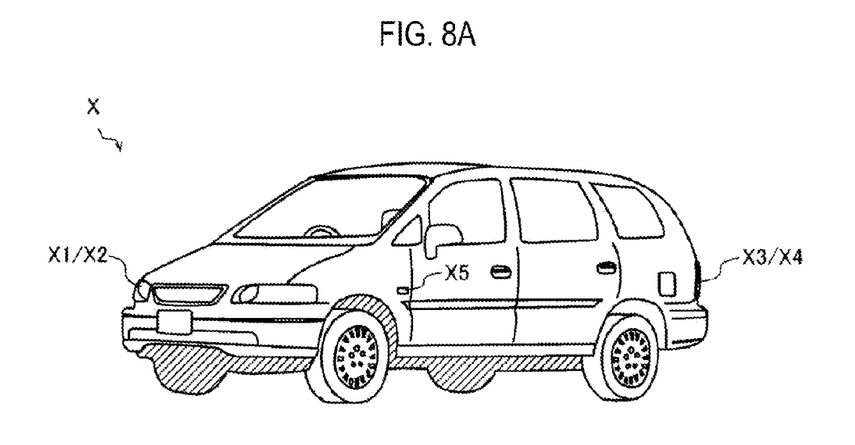
FIG. 8A is a view showing an external appearance of a vehicle equipped with a vehicle LED drive IC (when viewed from the front).
Figure 8B:
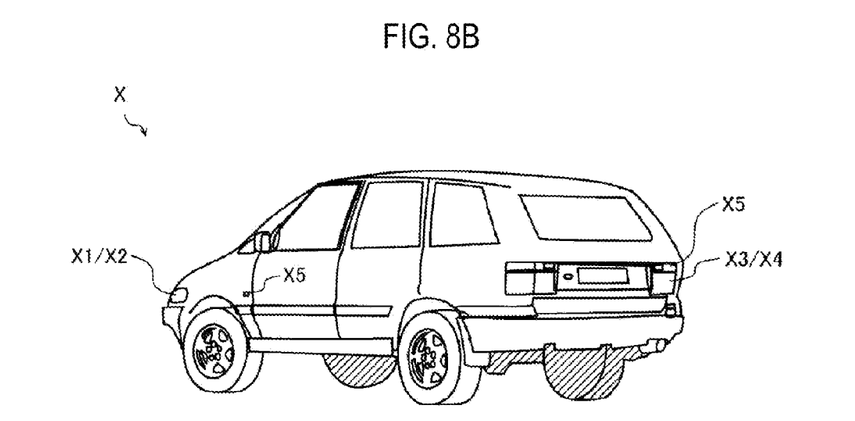
FIG. 8B is a view showing an external appearance of the vehicle equipped with the vehicle LED drive IC(when viewed from the rear).
Figure 9A:
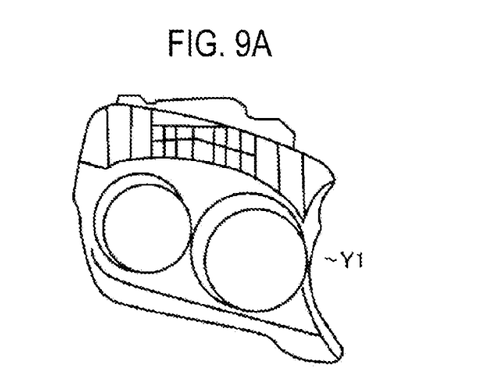
FIG. 9A is a view showing an external appearance of an LED headlight module.
Figure 9B:
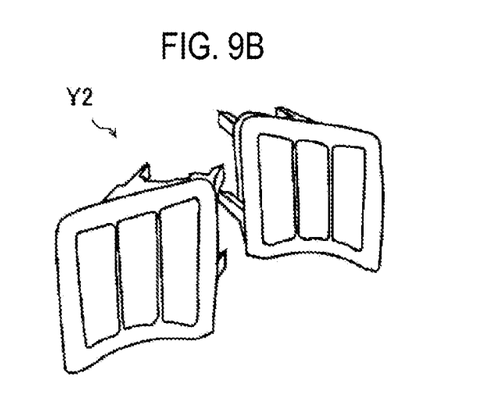
FIG. 9B is a view showing an external appearance of an LED turn lamp module.
Figure 9C:
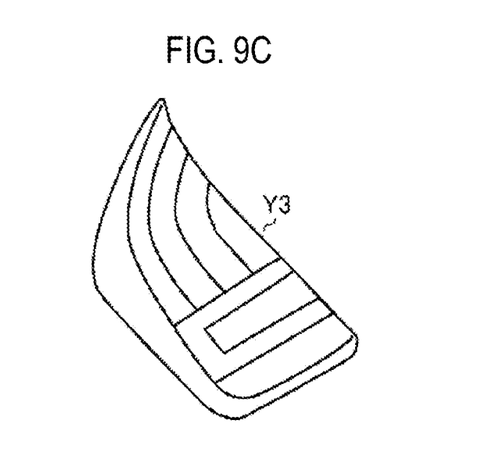
FIG. 9C is a view showing an external appearance of an LED rear lamp module.

The IC 100 may be used as driving means for a headlight (appropriately including high beam/low beam/small ramp/fog ramp, etc.) X1, a light source X2 for daytime running light (DRL), a tail ramp (appropriately including a small ramp, back ramp, etc.) X3, a stop lamp X4, a turn lamp X5, etc. of a vehicle X, as shown in FIGS. 8A and 8B. In addition, the IC 100 may be provided as an LED lamp module (an LED headlight module Y1 shown in FIG. 9A, an LED turn lamp module Y2 shown in FIG. 9B, an LED rear ramp module Y3 shown in FIG. 9C, etc.) along with an LED to be driven or may be provided as a single IC independent of the LED.

In addition, the IC 100 may be used for applications (head-up displays (HUDs) and so on) requiring a high brightness LED light source, in addition to the vehicle exterior lightings.

<Other Modifications>

In addition to the above embodiments, the present disclosure can be modified in various ways without departing from the spirit and scope of the disclosure. For example, although it has been illustrated in the above embodiments that the spirit of the disclosure is applied to the vehicle LED driver IC, the spirit of the disclosure is not limited thereto but may be applied to a general oscillation circuit having a frequency spreading function.

The present disclosure can be used in, for example, oscillation circuits of vehicle LED driver ICs.

According to the present disclosure in some embodiments, it is possible to provide an oscillation circuit which is capable of realizing a frequency spreading function in a simple manner.

While certain embodiments have been described, these embodiments have been presented by way of example only, and are not intended to limit the scope of the disclosures. Indeed, the novel methods and apparatuses described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. An oscillation circuit comprising:
   a ramp voltage generating unit configured to generate a ramp voltage; and
   a clock signal generating unit configured to generate a clock signal,
   wherein the clock signal generating unit includes:
      a bias unit configured to apply one of the ramp voltage and a fixed voltage, as a bias voltage, to a resistor; and
      an oscillator configured to determine an oscillation frequency of the clock signal in response to a bias current flowing through the resistor,
   wherein the ramp voltage generating unit includes:
      a first current source configured to generate a charging current of a capacitor;
      a second current source configured to generate a discharging current of the capacitor;
      a hysteresis comparator configured to generate a comparison signal by comparing a voltage across the capacitor with a threshold voltage; and
      a charging/discharging control unit configured to switch between charging and discharging of the capacitor in response to the comparison signal,
   wherein the voltage across the capacitor is output as the ramp voltage,
   wherein the bias unit applies a lower one of the ramp voltage and the fixed voltage, as the bias voltage, to the resistor, and
   wherein the ramp voltage generating unit includes a pull-up unit configured to make the ramp voltage higher than the fixed voltage at the start of the oscillation circuit.

2. The oscillation circuit of claim 1, wherein the first current source and the second current source determine values of the charging current and the discharging current in response to the bias current.

3. A semiconductor device comprising the oscillation circuit of claim 2, wherein the oscillation circuit is integrated into the semiconductor device.

4. The semiconductor device of claim 3, further comprising:
   a first external terminal connected to the resistor; and
   a second external terminal connected to the capacitor.

5. The semiconductor device of claim 3, further comprising a switching power supply circuit configured to generate an output voltage from an input voltage using the clock signal generated in the oscillation circuit.

6. An LED (Light Emitting Diode) lighting device comprising:
   an LED; and
   the semiconductor device of claim 5, wherein the semiconductor device is configured to supply the output voltage to the LED.

7. The LED lighting device of claim 6, which is provided as an LED headlight module, an LED turn lamp module or an LED rear lamp module.

* * * * *